(12) United States Patent
Thackeray et al.

(10) Patent No.: US 7,585,612 B2
(45) Date of Patent: Sep. 8, 2009

(54) COATING COMPOSITIONS FOR USE WITH AN OVERCOATED PHOTORESIST

(75) Inventors: James W. Thackeray, Braintree, MA (US); Gerald B. Wayton, Leicester, MA (US); Charles R. Szmanda, Westborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 11/481,209

(22) Filed: Jul. 5, 2006

(65) Prior Publication Data

US 2007/0042289 A1 Feb. 22, 2007

Related U.S. Application Data

(60) Provisional application No. 60/696,980, filed on Jul. 5, 2005.

(51) Int. Cl.
*G03C 1/825* (2006.01)
(52) U.S. Cl. .................. 430/271.1; 430/270.1
(58) Field of Classification Search .............. 430/270.1, 430/271.1, 276.1, 510, 512
See application file for complete search history.

(56) References Cited

U.S. PATENT DOCUMENTS

| | | | |
|---|---|---|---|
| 5,654,376 A * | 8/1997 | Knors et al. ............. | 525/327.4 |
| 6,410,209 B1 * | 6/2002 | Adams et al. ............... | 430/311 |
| 6,797,456 B1 | 9/2004 | Gu et al. .................... | 430/312 |
| 2002/0013560 A1 * | 1/2002 | Erspamer et al. ........... | 604/381 |
| 2003/0129531 A1 * | 7/2003 | Oberlander et al. ....... | 430/271.1 |
| 2004/0197709 A1 | 10/2004 | Arase et al. ................. | 430/313 |
| 2005/0170283 A1 * | 8/2005 | Hohle ..................... | 430/270.1 |
| 2005/0181299 A1 | 8/2005 | Trefonas, III et al. .... | 430/270.1 |
| 2006/0057507 A1 * | 3/2006 | Chang et al. ................ | 430/327 |
| 2006/0068335 A1 | 3/2006 | Coley et al. ................. | 430/330 |
| 2006/0118956 A1 | 6/2006 | Ho et al. ..................... | 257/758 |

FOREIGN PATENT DOCUMENTS

| | | | |
|---|---|---|---|
| EP | 0 905 565 A | | 3/1999 |
| EP | 1 298 493 A | * | 4/2003 |
| WO | WO 03/017002 | * | 2/2003 |
| WO | WO 2005/066240 A1 | | 7/2005 |

* cited by examiner

*Primary Examiner*—Cynthia H Kelly
*Assistant Examiner*—Anca Eoff
(74) *Attorney, Agent, or Firm*—Peter F. Corless; Darryl P. Frickey; Edwards Angell Palmer & Dodge LLP

(57) ABSTRACT

Underlying coating compositions are provided for use with an overcoated photoresist composition. In one aspect, the coating composition can be crosslinked and comprise one or more components that contain one or more acid-labile groups and/or one or more base-reactive groups that are reactive following crosslinking. In another aspect, underlying coating composition are provided that can be treated to provide a modulated water contact angle. Preferred coating compositions can enhance lithographic performance of an associated photoresist composition.

10 Claims, No Drawings

COATING COMPOSITIONS FOR USE WITH AN OVERCOATED PHOTORESIST

The present application claims the benefit of U.S. provisional application No. 60/696,980, filed Jul. 5, 2005, which is incorporated by reference herein in its entirety.

The present invention relates to compositions (particularly antireflective coating compositions or "ARCs") for use with an overcoated photoresist composition. In one aspect, the coating composition can be crosslinked and comprise one or more components that contain one or more acid-labile groups and/or one or more base-reactive groups that are reactive following crosslinking. In another aspect, underlying coating composition are provided that can be treated to provide a modulated water contact angle.

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced or chemical transformation of the photoresist coating to thereby transfer the pattern of the photomask to the photoresist-coated substrate. Following exposure, the photoresist is developed to provide a relief image that permits selective processing of a substrate.

A major use of photoresists is in semiconductor manufacture where an object is to convert a highly polished semiconductor slice, such as silicon or gallium arsenide, into a complex matrix of electron conducting paths that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer interposed between the substrate surface and the photoresist coating layer. See U.S. Patent Publication 2004/0197709.

Electronic device manufacturers continually seek increased resolution of a photoresist image patterned over antireflective coating layers.

In particular, so-called photoresist pattern collapse occurs where photoresist patterns disintegrate during the developing process, especially at increasingly small photoresist images photoresist patterns used at the 90-nm process node and below. Organic residues of photoresists and/or antireflective coating composition that remain in wafer areas that are intended to be bared upon development also are problematic and can require additional processing steps to remove such residues or wafer defects if not removed. Device manufacturers strive to avoid such pattern collapse and problematic deposition of organic residues.

We now provide new organic coating compositions that can provide a modulated (changed) water contact angle.

In a first preferred aspect, organic coating compositions of the invention may be treated to provide a decreased water contact angle. In such aspects, composition coating layer areas that are treated to provide a decreased water contact angle are rendered more hydrophilic.

In a further aspect, organic coating compositions of the invention may be treated to provide an increased water contact angle. In such aspects, composition coating layer areas that are treated to provide an increased water contact angle are rendered more hydrophobic.

Preferred coating compositions of the invention are crosslinked prior to treatment to modulate water contact angle. Such crosslinking includes hardening and covalent-bonding forming reactions between one or more composition components.

Preferably, such crosslinking of a coating composition of the invention should not result in reaction of acid-labile or base-reactive groups that are intended to react during subsequent lithographic processing of an overcoated photoresist layer. Thus, for example, if the coating composition is crosslinked in the presence of acid such as generated from a thermal acid generator, the acid-promoted crosslinking reaction should not significantly cause reaction of photoacid-labile groups of the coating composition.

Coating compositions of the invention may be treated by a variety of methods to modulate the water contact angle of composition coating layer areas. For instance, a coating composition layer may be treated with radiation such as sub-300 nm or sub-200 nm radiation, or thermally. Preferred treatments involve contacting a coating composition layer with acid and/or base to provide a modulated water contact angle of those composition coating layer areas that contact the acid or base.

Thus, for instance, in preferred aspect, a coating composition of the invention comprises one or more components that will be reactive to photoacid generated in an overcoated layer, particularly an overcoated photoresist composition layer.

The photogenerated acid can migrate from the photoresist layer to at least top portions of the underlying coating composition layer and react with one or more components in the underlying coating composition. For instance, the underlying composition coating layer may comprise one or more components that contain photoacid-labile groups such as esters or acetals that will react with the migrating photoacid particularly during post-exposure bake processing of the overcoated resist and thereby provide polar, more hydrophilic groups such as hydroxy or carboxylic acid which will decrease the water contact angle of the underlying composition coating layer. As discussed above, such a deprotection reaction suitably may occur at temperatures and conditions distinct than prior crosslinking of the underlying composition coating layer.

Preferably, upon treatment such as by acid or base, the water contact angle of an applied composition coating layer will be modulated (increased or decreased) by at least 5, 10, 15, 20 or 30 percent.

In another preferred aspect, a coating composition of the invention may comprise one or more components that will be reactive to base such as an aqueous alkaline photoresist developer composition. The basic composition will contact at least top portions of the underlying coating composition layer and react with one or more components in the underlying coating composition. For instance, the underlying composition coating layer may comprise one or more components that contain anhydride groups that ring-open in the presence of base such as aqueous alkaline photoresist developer composition to thereby provide carboxylic acid moieties which will decrease the water contact angle of the underlying composition coating layer.

In another aspect, a coating composition of the invention may comprise one or more components that will be reactive to photoacid generated in an overcoated layer particularly an overcoated photoresist composition layer. In this aspect, reaction with the photogenerated acid increases the water contact angle of the underlying composition coating layer. For instance, the photoacid-generated acid may induce or otherwise result in crosslinking or more extensive crosslinking of one or more components of the underlying coating composition, which can increase the water contact angle of that composition coating layer.

As indicated above, underlying compositions of the invention also preferably contain a component that comprises chromophore groups that can absorb undesired radiation used to expose the overcoated resist layer from reflecting back into the resist layer. Such chromophore groups may be present with other composition components such as the resin(s) or an acid generator compound, or the composition may comprise another component that may comprise such chromophore units, e.g. a small molecule (e.g. MW less than about 1000 or 500) that contains one or more chromophore moieties, such as one or more optionally substituted phenyl, optionally substituted anthracene or optionally substituted naphthyl groups.

Generally preferred chromophores for inclusion in an underlying coating composition of the invention particularly those used for antireflective applications include both single ring and multiple ring aromatic groups such as optionally substituted phenyl, optionally substituted naphthyl, optionally substituted anthracenyl, optionally substituted phenanthracenyl, optionally substituted quinolinyl, and the like. Particularly preferred chromophores may vary with the radiation employed to expose an overcoated resist layer. More specifically, for exposure of an overcoated resist at 248 nm, optionally substituted anthracene and optionally substituted naphthyl are preferred chromophores of the antireflective composition. For exposure of an overcoated resist at 193 nm, optionally substituted phenyl and optionally substituted naphthyl are particularly preferred chromophores of the antireflective composition. Preferably, such chromophore groups are linked (e.g. pendant groups) to a resin component of the antireflective composition.

As discussed above, coating compositions of the invention preferably are crosslinking compositions and contain a material that will crosslink or otherwise cure upon e.g. thermal or activating radiation treatment. Typically, the composition will contain a crosslinker component, e.g. an amine-containing material such as a melamine, glycouril or benzoguanarnine compound or resin.

Preferably, crosslinking compositions of the invention can be cured through thermal treatment of the composition coating layer. Suitably, the coating composition also contains an acid or more preferably an acid generator compound, particularly a thermal acid generator compound, to facilitate the crosslinking reaction.

For use as an antireflective coating composition, as well as other applications such as via-fill, preferably the composition is crosslinked prior to applying a photoresist composition layer over the composition layer.

Particularly preferred underlying coating compositions of the invention may additionally comprise one or more photoacid generator compounds. It has been found that inclusion of one or more photoacid generator compounds in the underlying coating composition can provide enhanced lithographic performance, including reduced undesired photoresist residues remaining in microvias after photoresist development as well as increased depth-of-focus (i.e. enlarged processing window) values. A wide of variety of photoacid generator compounds may be employed in an underlying coating compositions including ionic photoacid generator compound such as onium salts (such as sulfonium and/or iodonium compounds), and non-ionic photoacid generators such as imidosulfonates, N-sulfonyloxyimides, disulfone compounds, and nitrobenzyl-based photoacid generators, and other photoacid generators that have been used in photoresist compositions. Such one or more photoacid generator compounds may be employed in a coating composition underlying a photoresist in addition to another acid source (such as a thermal acid generator which is commonly an acid salt). Thus, for instance, thermal treatment of an underlying coating composition prior to overcoating a photoresist composition can activate acid from the thermal acid generator component which acid can participate in crosslinking or other hardening of the coating composition. That thermal treatment may not significantly activate or otherwise impact one or more photoacid generator compound present in the coating composition, i.e. the thermal treatment does not significantly liberate acid from the one or more photoacid generator compounds. Then, after the photoresist layer has been applied over the coating composition layer and the resist layer is imaged with patterned radiation (e.g. 193 nm or 248 nm), that radiation can penetrate through the resist layer to the underlying coating composition layer and activate the one or more photoacid generator compounds to generate acid. Such photogenerated acid may e.g. react with acid-labile groups of a resin component of an underlying coating composition.

Coating compositions of the invention are typically formulated and applied to a substrate as an organic solvent solution, suitably by spin-coating (i.e. a spin-on composition).

A variety of photoresists may be used in combination (i.e. overcoated) with a coating composition of the invention. Preferred photoresists for use with the antireflective compositions of the invention are chemically-amplified resists, especially positive-acting photoresists that contain one or more photoacid generator compounds and a resin component that contains units that undergo a deblocking or cleavage reaction in the presence of photogenerated acid, such as photoacidlabile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as 248 nm, or radiation having a wavelength of less than about 200 nm such as 193 nm.

The invention further provides methods for forming a photoresist relief image and novel articles of manufacture comprising substrates (such as a microelectronic wafer substrate) coated with a coating composition of the invention alone or in combination with a photoresist composition.

As discussed above, preferred coating compositions of the invention can provide an increased or decreased water contact angle. As referred to herein, water contact angles of a coating composition of the invention may be determined by applying a composition layer such as by spin-coating onto a substrate such as a microelectronic wafer substrate. Spin-speeds can be varied as necessary to obtain film thickness in the range of 40-120 nm. The applied composition layer then may be thermally treated (e.g., 180° C. for 60 seconds on a proximity hotplate) such as to remove casting solvent and to crosslink or otherwise harden the coating layer. Contact angle measurements of the thus treated coating composition layer may be determined such as by use of a commercially available device such as those devices produced by Kruss GmbH of Hamburg Germany, including the JDSA-100 Dynamic Contact Angle Goniometer.

Other aspects of the invention are disclosed infra.

We now provide new organic coating compositions that are particularly useful with an overcoated photoresist layer. Preferred coating compositions of the invention may be applied by spin-coating (spin-on compositions) and formulated as a solvent composition. The coating compositions of the invention are especially useful as antireflective compositions for an overcoated photoresist and/or as planarizing or via-fill compositions for an overcoated photoresist composition coating layer.

We have found that preferred underlying coating compositions can provide reduced defects in a processed substrate, particularly reduced deposition of organic residues in substrates areas that are intended to be bared of photoresist. Additionally, use of preferred underlying coating compositions can reduce or minimize the occurrence of undesired pattern collapse of a photoresist relief image formed over the underlying layer.

Without being bound by any theory, it is believed that by modulating the water contact angle of the underlying composition coating layer, at least in top portions of the underlying coating composition coating layer, the underlying layer can be removed more effectively by photoresist developer solutions. Thereby, undesired organic residues will be less prone to remain in substrate areas intended to be bared following development.

Also without being bound by any theory, it is believed that preferred underlying coating compositions of the invention can provide more effective adherence to an overcoated photoresist relief image and thereby enable reduced occurrence of undesired pattern collapse of resist relief images.

Coating Compositions:

In one aspect of the invention, coating compositions are provided that can be treated to provide a different water contact angle, e.g. where the water contact angle is changed by treatment with acid or base.

As discussed above, a coating composition may suitably comprise photoacid-labile groups or base-reactive groups such as anhydride groups which can react with acid or base respectively to provide a decreased water contact angle in those coating layer regions where acid or base contacts the coating layer.

In a preferred aspect, an underlying coating composition may comprise: a resin component and one or more photoacid generator compounds. In another preferred aspect, an underlying coating composition may comprise: a resin component and one or more thermal acid generator compounds. In a yet further aspect, an underlying coating composition may comprise: a resin component, one or more thermal acid generator compounds, and one or more photoacid generator compounds. In such preferred aspects, the resin component may comprise a resin that comprises acid-labile and/or anhydride groups. In such preferred aspects, the underlying coating composition also may comprise a crosslinker component.

Suitable photoacid-labile groups for use in an underlying coating composition include those discussed below for use in chemically-amplified positive photoresists. Generally preferred is to employ a resin component that contains one or more polymerized units that contain photoacid-labile groups such as pendant photoacid-labile esters (e.g. tert-butyl esters) or acetal groups. Also preferred is use of a component such ass a resin that contains one or more base-reactive groups, e.g. groups that can become more hydrophilic upon exposure to photoresist aqueous alkaline developer solutions. Preferred base-reactive groups include anhydride groups that can ring-open in the presence of suitable base to provide hydrophilic moieties. Exemplary suitable base-reactive anhydride groups include polymerized units of itaconic anhydride, citraconic anhydride, maleic anhydride, 3-methylene-dihydro-pyran-2, 6idione, 4-methylene-dihydro-pyran-2,6-dione, and 3H-pyran-2,6-dione. Such base-reactive groups may be polymerized units of a resin component of an underlying coating composition.

For antireflective applications, the resin component also may suitably comprise one or more chromophore groups which as discussed suitably may be optionally substituted carbocyclic aryl groups such as optionally substituted anthracene, optionally substituted naphthyl or optionally substituted phenyl groups. Preferred resins for use in underlying coating compositions are copolymers (includes terpolymers and other higher order polymers) that comprise 1) photoacid-labile groups and/or base-reactive groups such as anhydride groups and 2) chromophore groups. See the examples which follow for exemplary preferred copolymers for use in the present underlying coating compositions.

One or more resins of resin component of an underlying coating composition may have a variety of backbone structures. For example, suitable resins include polyesters, polyacrylates, polysulfones, polyamides, poly(vinylalcohols), and the like. Particularly preferred are resin components that comprise one or more polyester resins and/or one or more poly(acrylate) resins. Polyesters may be provided by polymerization of a carboxy-containing compound (such as a carboxylic acid, ester, anhydride, etc.) and a hydroxy-containing compound, preferably a compound having multiple hydroxy groups such as a glycol, e.g. ethylene glycol or propylene glycol, or glycerol, or other diols, triols, tetraols and the like. It will be understood that in such polyester resins at least certain of the ester groups are not photoacid-labile, i.e. the ester repeat units do not undergo deblocking or other cleavage during typical lithographic processing of pre-exposure bake, exposure to activating radiation, post-exposure heating, and/or development, although the polyester resin also may include photoacid-labile ester groups. Preferably, ester repeat units are present in the polymer backbone, i.e. the ester groups (—(C=O)O—) are present on the branched or substantially linear chain that forms the polymer length. Also preferred is that such ester groups contain aromatic substitution, e.g. a phenyl, naphthyl or anthracene group, such as may be provided by reaction of a an alkyl phthalate with a polyol.

Such polyester resins are suitably prepared by charging a reaction vessel with the a polyol, a carboxylate compound, and other compounds to be incorporated into the formed resin, an acid such as a sulfonic acid, e.g. methane sulfonic acid or para-toluene sulfonic acid, and the like. The reaction mixture is suitably stirred at an elevated temperature, e.g. at least about 80° C., more typically at least about 100° C., 110° C., 120° C., 130° C., 140° C., or 150° C. for a time sufficient for polymer formation, e.g. at least about 2, 3, 4, 5, 6, 8, 12, 16, 20, 24 hours. Exemplary preferred conditions for synthesis of useful resins are detailed in the examples which follow.

Acrylate-based resins also are preferred materials to use in underlying coating compositions of the invention. Such resins can be prepared by known methods, such as polymerization (e.g. in the presence of a radical initiator) of one or more acrylate monomers such as e.g. hydroxyethylmethylacrylate, hydroxyethylacrylate, methylmethacrylate, butyl methacrylatemethylantbracene methacrylate or other anthracene acrylate and the like. See U.S. Pat. No. 5,886,102 assigned to the Shipley Company for exemplary suitable polymers. See also the examples which follow for suitable acrylate resins and syntheses thereof.

As discussed, for antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in an antireflective composition employed with a photoresist imaged at sub-200 nm wavelengths such as 193 nm. Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$-alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, underlying coating composition that are employed for antireflective purposes may contain a material that contains chromophore units that is separate from a resin component that provides water contact angle modulation (e.g. a resin that contains photoacid-labile groups and/or base-reactive groups). For instance, the coating composition may comprise a polymeric or non-polymeric compound that contain phenyl, anthracene, naphthyl, etc. units. It is often preferred, however, that the one or more resins that provide water contact angle modulation also chromophore moieties.

In certain suitable embodiments, a resin of an underlying coating composition may include repeat units that comprise one or more groups of: cyano, adamantyl, norbornyl, fluoro, fluoroalcohol (e.g. hexafluoropropylalcohol, $(CF_3)_2C(OH)$—), phenyl, naphthyl and/or anhydride, all of such groups may be present singularly in a resin, or two or more such groups may be present together in combination in a single resin.

Additionally, in certain preferred aspects, an underlying coating compositions may comprise a resin component that comprises (1) a resin that comprises one or more acid-labile groups and/or anhydride groups and (2) one or more polyester resins which suitably may be completely free or at least substantially free of acid-labile groups and/or anhydride groups. By stating that a polyester is "at least substantially free", it is meant that the resin contain less than 5 weight percent of acid-labile groups and/or anhydride groups, preferably less than 4, 3, 2, 1 or 0.5 weight percent of acid-labile groups and/or anhydride groups. Such underlying coating composition may comprise multiple polyester resins which may differ in composition. Preferred polyester resins for use in the resin component of an underlying component include those that contain phenyl and/or naphthyl moieties.

Preferably resins of underlying coating compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

As mentioned, preferred underlying coating compositions of the invention can be crosslinked, e.g. by thermal and/or radiation treatment. For example, preferred underlying coating compositions of the invention may contain a separate crosslinker component that can crosslink with one ore more other components of the coating composition. Generally preferred crosslinking coating compositions comprise a separate crosslinker component. Particularly preferred coating compositions of the invention contain as separate components: a resin, a crosslinker, and an acid source such as a thermal acid generator compound. Particularly preferred coating compositions of the invention also may contain as separate components: a resin, a crosslinker, one or more thermal acid generator compounds, and one or more photoacid generator compounds. Thermal-induced crosslinking of the coating composition by activation of the thermal acid generator is generally preferred.

Suitable thermal acid generator compounds for use in a coating composition include ionic or substantially neutral thermal acid generators, e.g. an ammonium arenesulfonate salt, for catalyzing or promoting crosslinking during curing of an antireflective composition coating layer. Typically one or more thermal acid generators are present in an coating composition in a concentration from about 0.1 to 10 percent by weight of the total of the dry components of the composition (all components except solvent carrier), more preferably about 2 percent by weight of the total dry components.

Preferred crosslinking-type coating compositions of the invention also contain a crosslinker component. A variety of crosslinkers may be employed, including those crosslinkers disclosed in Shipley European Application 542008 incorporated herein by reference. For example, suitable coating composition crosslinkers include amine-based crosslinkers such as melamine materials, including melamine resins such as manufactured by Cytec Industries and sold under the tradename of Cymel 300, 301, 303, 350, 370, 380, 1116 and 1130. Glycolurils are particularly preferred including glycolurils available from Cytec Industries. Benzoquanamines and urea-based materials also will be suitable including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A crosslinker component of a coating composition of the invention in general is present in an amount of between about 5 and 50 weight percent of total solids (all components except solvent carrier) of the antireflective composition, more typically in an amount of about 7 to 25 weight percent total solids.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

As discussed above, particularly preferred underlying coating compositions of the invention may additionally comprise one or more photoacid generator compounds. It has been found that inclusion of one or more photoacid generator compounds in the underlying coating composition can provide enhanced lithographic performance, including reduced undesired photoresist residues remaining in microvias after photoresist development as well as increased depth-of-focus (i.e. enlarged processing window) values. A wide of variety of photoacid generator compounds may be employed in an underlying coating compositions including ionic and compounds e.g. onium salts (such as sulfonium and/or iodonium compounds), and non-ionic photoacid generators such as imidosulfonates, N-sulfonyloxyimides, disulfone compounds, and nitrobenzyl-based photoacid generators, and other photoacid generators that have been used in photoresist compositions. Specifically suitable photoacid generator compounds for use in the present coating compositions include those identified below for use in photoresist compositions as well as the ionic and non-ionic photoacid generators disclosed in U.S. Pat. Nos. 6,20,911 and 6,803,169, such as sulfonium compounds including triphenyl sulfonium salts, iodonium compounds including diphenyl iodonium compounds and imidosulfonates and other non-ionic photoacid generator compounds. Other particularly suitable photoacid generator compounds for use in the present underlying photoresist compositions include N-[(perfluorooctanesulfonyl)oxy]-5-norbornene-2,3-dicarboximide. In certain aspects, diazonapthoquinone materials are not employed in any significant extent (e.g. greater than 2, 1 or 0.5 weight percent based on total fluid composition weight) in an underlying coating composition, or the underlying coating composition may be free of any diazonapthoquinone materials.

One or more photoacid generators may be employed in an underlying coating composition in a variety of amounts, e.g. where the one or more photoacid generator compounds are percent in amounts of about 5 weight percent or less based on total solids (all components except solvent carrier) of an underlying coating composition, suitably less than 4, 3, 2 or even 1 weight percent of total solids of an underlying coating composition.

As discussed above, such one or more photoacid generator compounds may be employed together with an additional acid source (such as a thermal acid generator which is commonly an acid salt) that may be present in the underlying coating composition. A thermal acid generator compound is often an acid salt complex which dissociates upon thermal treatment, but may not be significantly activated (e.g. no bond-breaking reactions) upon treatment with radiation used to expose and overcoated photoresist composition.

More specifically, as discussed above, a thermal acid generator component may be activated by thermal treatment prior to application of an overcoating photoresist layer. One or more photoacid generator compounds may be subsequently activated during exposure (such as at 193 nm or 248 nm) of the overcoated photoresist layer.

To make a liquid coating composition of the invention, the components of the coating composition are dissolved in a suitable solvent such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an underlying coating composition varies from about 0.5 to 20 weight percent of the total weight of the coating composition, preferably the solids content varies from about 2 to 10 weight of the coating composition.

Exemplary Photoresist Systems

A variety of photoresist compositions can be employed with coating compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition.

As discussed above, particularly preferred photoresists for use with underlying coating compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793. Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090,526.

Underlying coating compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462; iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Suitable photoacid generators to employ in a positive or negative acting photoresist overcoated over a coating composition of the invention include imidosulfonates such as compounds of the following formula:

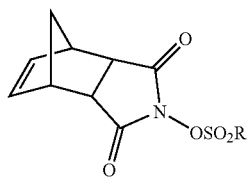

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

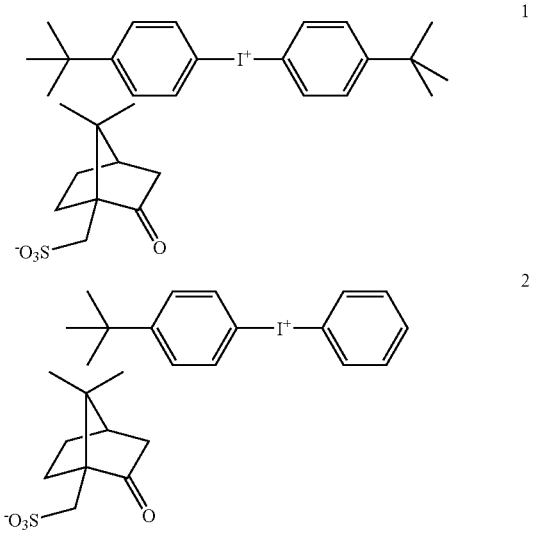

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3-$ where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresist used with underlaying coating compositions.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 µm, preferably a dried layer thickness of between about 0.04 and 0.20 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 40 minutes. Cure conditions preferably render the coating composition coating layer substantially insoluble to the photoresist solvent as well as an alkaline aqueous developer solution.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

As discussed above, underlying coating compositions can provide reduced defects in a processed substrate, particularly reduced deposition of organic residues in substrates areas that are intended to be bared of photoresist. Additionally, use of underlying coating compositions can reduce or minimize the occurrence of undesired pattern collapse of a photoresist relief image formed over the underlying layer.

The following non-limiting examples are illustrative of the invention.

EXAMPLES 1-3

Syntheses of Polymers Useful in Coating Compositions

Example 1

Polyester Synthesis

All reagents were initially charged into the reactor with little regard to the order of addition. Charge: dimethylterephthalate (22.3 g, 115 mmol), dimethyl 5-hydroxyisophthalate (18.1 g, 86 mmol), 1,3,5-tris(2-hydroxyethyl)isocyanurate (52.5 g, 201 mmol), 2-hydroxyisobutyric acid (17.9 g, 172 mmol), p-toulenesulfonic acid (2.1 g, 11 mmol), and anisole (80 g). The reaction setup consisted of a 250-mL, three-neck, round-bottom flask fitted with a mechanical stirrer, temperature control box, temperature probe, heating mantle, condenser, Dean-Stark trap, and nitrogen purge inlet (sweep). The mixture was heated first to substantial reflux (120-150 C), and then gradually to a peak temperature of 150 C within 30 minutes. The temperature was maintain until a total reaction time, which was marked from the point of substantial reflux, had reached 5.25 h. The heat source was then removed, and the mixture was allowed to cool. The cooled solution was then diluted with THF (355 g) and precipitated into IPA. The polymer was collected by filtration through a Buchner funnel, air-dried, and then dried in vacuo between 40-70° C. The polymer yield was 28%. The molecular weight was determined by GPC; Mw=2840 and Mn=2064.

Example 2

Synthesis of Resin Containing Acid-Cleavable Group

Charged into a 500-mL, three-neck, round-bottom flask, fitted with a mechanical stirrer, temperature control box, temperature probe, dropping funnel, condenser, and nitrogen inlet (blanket) was t-butylmethacrylate (11.90 g, 83 mmol), 2-hydroxyethylmethacrylate (19.85 g, 153 mmol), styrene (6.91 g, 66 mmol), methyl methacrylate (12.55 g, 126 mmol), and methyl 2-hydroxyisobutyrate (HBM) (200 g). To the dropping funnel was charge a solution of Vazo-67 (Dupont) (4 g) dissolved in HBM (16 g). The monomeric mixture was heated with agitation to 85° C., before addition of the initiator. The time of addition was noted, and the mixture was allowed to continue reacting at 85 C for 22 h. The reaction was then thermally quenched by removing the heat source and allowing the mixture to cool to room temperature. The polymer was allowed to remain in solution at 25% solids. The molecular weight was determined by GPC; Mw=11010, and Mn=4704.

Example 3

Synthesis of Resin Containing Ring-Opening Anhydride

Charged into a 500-mL, three-neck, round-bottom flask, fitted with a mechanical stirrer, temperature control box, temperature probe, dropping funnel, condenser, and nitrogen inlet (blanket) was n-butylmethacrylate (27.20 g, 192 mmol), 2-hydroxyethylmethacrylate (9.95 g, 77 mmol), itaconic anhydride (12.80 g, 114 mmol), and methyl 2-hydroxyisobutyrate (HBM) (280 g). To the dropping funnel was charge a solution of Vazo-67 (Dupont) (2 g) dissolved in HBM (16 g). The monomeric mixture was heated with agitation to 85 C, before addition of the initiator. The time of addition was noted, and the mixture was allowed to continue reacting at 85° C. for 22 h. The reaction was then thermally quenched by removing the heat source and allowing the mixture to cool to room temperature. The polymer was allowed to remain in solution at 15% solids. The molecular weight was determined by GPC; Mw=16258, and Mn=6444.

Examples 4-12

Contact Angle Switches

Nine underlying coating compositions (referred to below as Coating compositions 1 through 9) were prepared by admixing the components as set forth in the following Table 1:

TABLE 1

| Example No. | Coating Composition No. | Resin 1 | Resin 2 | Crosslinker | Acid source | Solvent |
|---|---|---|---|---|---|---|
| 4 | 1 | TBMA/HEMA/STY/MMA (10/25/15/30) | None | Glycouril resin | pTSA•NH$_3$ | HBM |
| 5 | 2 | HEMA/CNAMA (50:50) | Polyester 1 | Glycouril resin | pTSA•NH$_3$ | HBM |
| 6 | 3 | HEMA/CNNMA (50:50) | Polyester 2 | Glycouril resin | pTSA•NH$_3$ | HBM |
| 7 | 4 | MAMA/HEMA (30:70) | Polyester 1 | Glycouril resin | pTSA•NH$_3$ | HBM |
| 8 | 5 | MAMA/HEMA (30:70) | Polyester 2 | Glycouril resin | pTSA•NH$_3$ | HBM |
| 9 | 6 | ECPMA/HEMA (30:70) | Polyester 1 | Glycouril resin | pTSA•NH$_3$ | HBM |
| 10 | 7 | ECPMA/HEMA (30:70) | Polyester 2 | Glycouril resin | pTSA•NH$_3$ | HBM |
| 11 | 8 | nBMA/HEMA/IA (50:20:30) | Polyester 1 | Glycouril resin | pTSA•NH$_3$ | HBM |
| 12 | 9 | nBMA/HEMA/IA (50:20:30) | Polyester 2 | Glycouril resin | pTSA•NH$_3$ | HBM |

In the above Table 1, the following abbreviations designate the following materials: TBMA: tert-butyl methacrylate; HEMA: 2-hydroxyethyl methacrylate; STY: styrene; MMA: methyl methacrylate; CNNMA:, 5-cyano-2-norbornyl-methacrylate; MAMA: 2-methyl-2-adamantyl methacrylate; ECPMA: 1-ethyl-1-cyclopentyl methacrylate; n-BMA; n-butyl methacrylate; IA: itaconic anhydride; polyester 1: polyester resin containing phenyl groups; polyester 2: polyester resin containing both phenyl and naphthyl groups; pTSA•NH$_3$: ammonia salt of p-toluene sulfonic acid; HBM: methyl 2-hydroxyisobutyrate. In Table 1, the numerical values (e.g. (10/25/15/30)) following the designated polymerized monomers specify the molar charge of the monomers in the resin preparation. The glycouril resin is sold under the tradename Powderlink 1774 by Cytec Industries. In those Coating Compositions 1 through 9, the cross-linker resin is present at about 15 weight percent of the resin component and the acid source (thermal acid generator) is present at about 0.8 weight percent of total solids (all materials except solvent). The solvent is present in an amount of about 96 weight percent of the total coating composition weight.

Each of the Coating Compositions 1 through 9 is spin coating onto a silicon wafer substrate and baked at 175° C. to remove solvent and harden or crosslink the coating composition layers.

For Coating Compositions 1 through 7 (Examples 4 through 10), a 193 nm photoresist composition was spin-coated over the coating composition and regions of the photoresist composition were exposed to 193 nm radiation at varying energy doses. The exposed photoresist layers were then post-exposure baked at about 110° C. for 60 seconds and the baked photoresist layers were developed with aqueous alkaline developer. Following development, water contact angles of the underlying coating compositions were determined using a JDSA-100 Dynamic Contact Angle Goniometer (Kruss GmbH). Water contact angles of the underlying coating composition layer also were tested in areas that were not contacted with exposed photoresist. Results are set forth in Table 2 below.

For coating Compositions 8 and 9 (Examples 11 and 12), underlying coating compositions were treated with 0.26N aqueous alkaline photoresist developer solution. Water contact angles of the coating layer contacted and non contacted with photoresist developer were determined using a JDSA-100 Dynamic Contact Angle Goniometer (Kruss GmbH). Results for those Coating Compositions 8 and 9 also were set forth in Table 2 below.

TABLE 2

| Example No. | Coating Composition No. | $H_2O$ contact angle at no exposure | $H_2O$ contact angle after 17 mJ/cm$^2$ | $H_2O$ contact angle after 27 mJ/cm$^2$ | $H_2O$ contact angle after 37 mJ/cm$^2$ |
|---|---|---|---|---|---|
| 4 | 1 | 76 | 57 | 56 | 55 |
| 5 | 2 | 55 | 47 | 48 | 48 |
| 6 | 3 | 74 | 54 | 53 | 53 |
| 7 | 4 | 50 | 46 | 45 | 45 |
| 8 | 5 | 70 | 53 | 52 | 52 |
| 9 | 6 | 49 | 44 | 44 | 44 |
| 10 | 7 | 63 | 50 | 50 | 50 |
| 11 | 8 | 85 | 56 | 50 | 55 |
| 12 | 9 | 85 | 56 | 50 | 55 |

Example 13

Coating Composition Preparation and Lithographic Processing

A coating composition was prepared by admixing the following materials:

Resin Component
p-hydroxystyrene/tert-butylacrylate copolymer
anthracenemethacrylate/2-hydroxyethylmethacrylate copolymer Crosslinker Component
glycouril resin
melamine resin Acid Source
p-toulene sulfonic acid triethylamine salt Solvent
propylene glycol methyl ether
propylene glycol methyl ether acetate The two resins were present in about equal weight ratios. The crosslinker component was present in 11 weight percent of the resin component. The thermal acid generator compound was present in an amount of about 0.5 weight percent of total solids (all components expect solvent). The solvents were present in a weight ratio of 70:30 propylene glycol methyl ether: propylene glycol methyl ether acetate.

The formulated coating composition was spin coated onto a silicon microchip wafer and cured at 175° C. for 60 seconds on a vacuum hotplate to provide a dried, hardened coating layer thickness of 80 nm.

A commercially available 248 nm photoresist was then spin-coated over the cured coating composition layer. The applied resist layer was soft-baked at 100° C. for 60 seconds on a vacuum hotplate, exposed to patterned 248 nm radiation through a photomask, post-exposure baked at 110° C. for 60 seconds and then developed with 0.26 N aqueous alkaline developer to provide a resist relief image.

Example 14

Additional Coating Composition

A coating composition was prepared by admixing the following components:
1. Resin 1: Dihydropyran (DHP)/maleic anhydride (MA)/2-hydroxyethyl methacrylate (HEMA) (35/35/30)
2. Resin 2: Polyester with phenyl groups
3. Resin 3: Polyester with phenyl and naphthyl groups
4. Photoacid generator: triphenyl sulfonium salt
5. Thermal acid generator: pTSA-NH$_3$: ammonia salt of p-toluene sulfonic acid
5. Crosslinker: Glycouril resin
6. Solvent: methyl 2-hydroxyisobutyrate In that composition specified immediately above, the numerical values (35/35/30) following the designated polymerized monomers specify the molar charge of the monomers in the resin preparation. The glycouril resin is sold under the tradename Powderlink 1774 by Cytec Industries. In the Coating Composition, the cross-linker resin is present at about 15 weight percent of the resin component, the acid source (thermal acid generator) is present at about 0.8 weight percent of total solids and an photoacid generator is present at about 2% weight percent of total solids (all materials except solvent). The solvent is present in an amount of about 96 weight percent of the total coating composition weight.

The Coating Composition is spin coated onto a silicon wafer substrate and baked at 215° C. to remove solvent and harden or crosslink the coating composition layer.

A 193 nm photoresist composition was spin-coated over the coating composition and regions of the photoresist composition were exposed to 193 nm radiation at varying energy doses. The exposed photoresist layers were then post-exposure baked at about 110° C. for 60 seconds and the baked photoresist layers were developed with aqueous alkaline developer. Following development, water contact angles of the underlying coating compositions were determined using a JDSA-100 Dynamic Contact Angle Goniometer (Kruss GmbH). Water contact angles of the underlying coating composition layer also were tested in areas that were not contacted with exposed photoresist. Water contact angles of the coating layer contacted and non contacted with photoresist developer were determined using a JDSA-100 Dynamic Contact Angle Goniometer (Kruss GmbH). A water contact angle of 63 degrees was measured before exposure, and a water contact angle of 47 degrees was measured after exposure.

Example 15

Lithographic Testing

Two underlying coating compositions ("First Coating Composition" and "Second Coating Composition") were prepared with components and amounts thereof corresponding to the composition of Example 14 above, except the Second Coating Composition did not contain a photoacid generator compound.

The First Coating Composition and the Second Coating Composition were applied to a semiconductor wafer substrate that contained microvias. A 193 nm photoresist composition was overcoated the First Coating Composition and the Second Coating Composition as described in Example 14 above. The semiconductor wafer that was processed with the First Coating Composition had reduced photoresist scum at via bottoms relative to the semiconductor wafer that was processed with the Second Coating Composition. The semiconductor wafer that was processed with the First Coating Composition also exhibited enhanced depth-of-focus (DOF) values.

What is claimed is:

1. A coated substrate comprising:
    a crosslinked coating composition layer that can be treated to provide a different water contact angle, the coating composition comprising a component comprising a moiety selected from the group consisting of citraconic anhydride, 3-methylene-dihydro-pyran-2,6-dione, 4-methylene-dihydro-pyran-2,6-dione, and 3H-pyran-2,6-dione; and
    a photoresist layer over the coating composition layer.

2. A method of forming a photoresist relief image, comprising:
    (a) applying a coating composition on a substrate, the applied composition comprising a component comprising a moiety selected from the group consisting of citraconic anhydride, 3-methylene-dihydro-pyran-2,6-dione, 4-methylene-dihydro-pyran-2,6-dione, and 3H-pyran-2,6-dione;
    (b) crosslinking the applied coating composition;
    (c) applying a photoresist composition above the crosslinked coating composition layer; and
    (d) exposing and developing the photoresist layer to provide a resist relief image, 3. The method of claim 2 wherein the coating composition comprises a crosslinker component.

4. The method of claim 3 wherein the crosslinker component comprises an amine-containing material.

5. The method of claim 3 wherein the crosslinker component comprises a melamine, glycouril or benzoguanamine compound or resin.

6. The method of claim 2 wherein the coating composition comprises a resin with phenyl or naphthyl groups.

7. The method of claim 2 wherein the photoresist is exposed with radiation having a wavelength of 193 nm.

8. The method of claim 6 wherein the photoresist is exposed with radiation having a wavelength of 193 nm.

9. The method of claim 2 wherein the coating composition comprises one or more acid-labile groups.

10. The method of claim 2 wherein the coating composition comprises one or more base-reactive groups.

* * * * *